(12) United States Patent
Choi

(10) Patent No.: US 9,324,969 B2
(45) Date of Patent: Apr. 26, 2016

(54) LIGHTING APPARATUS AND LIGHTING UNIT

(71) Applicant: SAMSUNG DISPLAY CO., LTD., Yongin, Gyeonggi-Do (KR)

(72) Inventor: Sung Jin Choi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 7 days.

(21) Appl. No.: 13/931,026

(22) Filed: Jun. 28, 2013

(65) Prior Publication Data

US 2014/0284557 A1  Sep. 25, 2014

(30) Foreign Application Priority Data

Mar. 22, 2013  (KR) .................. 10-2013-0031044

(51) Int. Cl.
*H01L 29/08* (2006.01)
*H01L 51/52* (2006.01)

(52) U.S. Cl.
CPC ................. *H01L 51/5268* (2013.01)

(58) Field of Classification Search
USPC .......................................................... 257/40
See application file for complete search history.

(56) References Cited

U.S. PATENT DOCUMENTS

| | | | | |
|---|---|---|---|---|
| 5,990,615 A * | 11/1999 | Sakaguchi | .......... | H01L 51/5237 313/504 |
| 2007/0176548 A1* | 8/2007 | Kim | .................. | H01L 51/5237 313/512 |
| 2009/0179573 A1* | 7/2009 | Kang | .................... | H01L 51/56 315/169.3 |
| 2011/0008593 A1* | 1/2011 | Abbott, Jr. | ................ | C03C 8/24 428/203 |
| 2011/0122628 A1* | 5/2011 | Han | .................... | H01L 51/5246 362/267 |
| 2011/0193102 A1* | 8/2011 | Nam | ................... | H01L 51/5203 257/79 |

FOREIGN PATENT DOCUMENTS

| | | |
|---|---|---|
| JP | 2008-108439 A | 5/2008 |
| KR | 10-2011-0058503 | 6/2011 |
| KR | 10-2011-0075684 | 7/2011 |
| KR | 10-2012-0128909 | 11/2012 |

* cited by examiner

*Primary Examiner* — Cuong Q Nguyen
*Assistant Examiner* — Nishath Yasmeen
(74) *Attorney, Agent, or Firm* — Lewis Roca Rothgerber Christie LLP

(57) ABSTRACT

A lighting apparatus and a lighting unit. The lighting apparatus includes: a first substrate; an organic light-emitting diode (OLED) which is disposed on the first substrate to define an emission region and emits light; a second substrate which faces the first substrate with the OLED interposed therebetween; and a sealant which is disposed between the first substrate and the second substrate, bonds the first substrate and the second substrate together, and surrounds the OLED at a set or predetermined distance from the OLED, wherein the sealant includes first light-scattering particles which are dispersed in the sealant and diffuse light incident to the sealant.

5 Claims, 13 Drawing Sheets

LIGHTING APPARATUS AND LIGHTING UNIT

CROSS-REFERENCE TO RELATED APPLICATION

This application claims priority to and the benefit of Korean Patent Application No. 10-2013-0031044, filed on Mar. 22, 2013 in the Korean Intellectual Property Office, the disclosure of which is incorporated herein by reference in its entirety.

BACKGROUND

1. Field

The following disclosure relates to a lighting apparatus and a lighting unit.

2. Description of the Related Art

An organic light-emitting diode (OLED) is a self-emitting device in which electrons and holes are recombined in an organic light-emitting layer to emit light as a voltage is applied to an anode, a cathode and the organic light-emitting layer disposed between the anode and the cathode.

Recently, various researches have been conducted to realize a display device using the OLED. The display device typically includes a first substrate, an OLED disposed on the first substrate, a second substrate which faces the first substrate with the OLED interposed therebetween, and a sealant which bonds the first substrate and the second substrate together.

A technology for realizing a lighting apparatus by applying the above structure of the display device has been suggested. However, if this comparable display structure is applied to a lighting apparatus, a dark area may be formed at edges of the lighting apparatus where the sealant is formed, and light loss may occur at the edges.

SUMMARY

Aspects of embodiments of the present invention are directed toward a lighting apparatus which can reduce the formation of a dark area at edges thereof and improve light efficiency, and a lighting unit including the lighting apparatus.

However, aspects of embodiments of the present invention are not restricted to the one set forth herein. The above and other aspects of the present invention will become more apparent to one of ordinary skill in the art to which the present invention pertains by referencing the detailed description of the embodiments of the present invention given below.

According to an embodiment of the present invention, there is provided a lighting apparatus including: a first substrate, an organic light-emitting diode (OLED) which is disposed on the first substrate to define an emission region and configured to emit light, a second substrate which faces the first substrate with the OLED interposed therebetween, and a sealant which is disposed between the first substrate and the second substrate, bonds the first substrate and the second substrate together, and surrounds the OLED at a predetermined distance from the OLED, wherein the sealant comprises first light-scattering particles which are dispersed in the sealant and configured to diffuse light incident to the sealant.

According to another embodiment of the present invention, there is provided a lighting apparatus including: a first substrate, an OLED which is disposed on the first substrate to define an emission region and configured to emit light, a second substrate which faces the first substrate with the OLED interposed therebetween, a sealant which is disposed between the first substrate and the second substrate, bonds the first substrate and the second substrate together, and surrounds the OLED at a predetermined distance from the OLED, and a light-scattering member which partially or wholly overlaps a non-emission region outside the emission region.

According to an embodiment of the present invention, there is provided a lighting unit including: a plurality of lighting apparatuses arranged in a tiled-shape, wherein each of the lighting apparatuses comprises a first substrate, an OLED which is disposed on the first substrate and configured to emit light, a second substrate which faces the first substrate with the OLED interposed therebetween, and a sealant which is disposed between the first substrate and the second substrate, bonds the first substrate and the second substrate together, and surrounds the OLED at a predetermined distance from the OLED, wherein the sealant comprises light-scattering particles which are dispersed in the sealant and configured to diffuse light incident to the sealant.

BRIEF DESCRIPTION OF THE DRAWINGS

The above and other aspects and features of the present invention will become more apparent by describing in more detail example embodiments thereof with reference to the attached drawings, in which.

DETAILED DESCRIPTION

Enhancements and features of the present invention and methods of accomplishing the same may be understood more readily by reference to the following detailed description of embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims, and equivalents thereof.

It will be understood that when an element or layer is referred to as being "on" another element or layer, it can be directly on the other element or layer, or one or more intervening elements or layers may be present. Like reference numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Hereinafter, embodiments of the present invention will be described with reference to the accompanying drawings.

Figure 1:
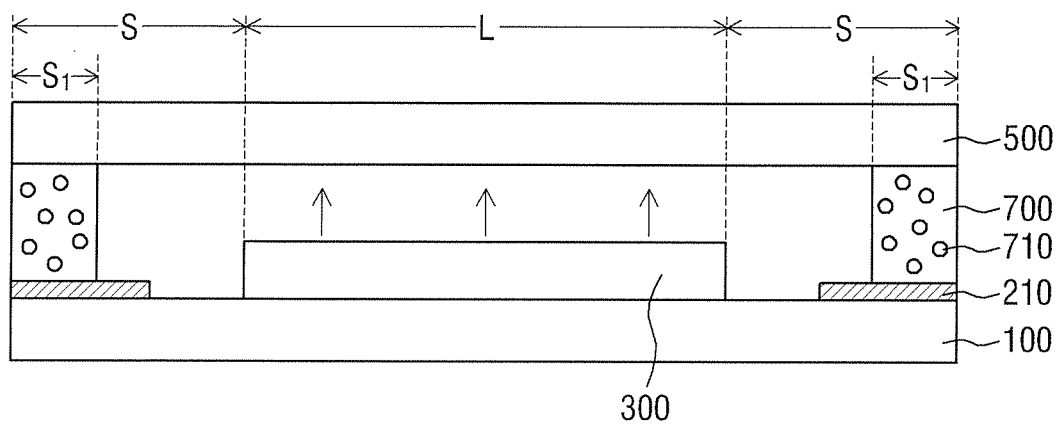
FIG. 1 is a cross-sectional view of a lighting apparatus according to an embodiment of the present invention.
Figure 2:
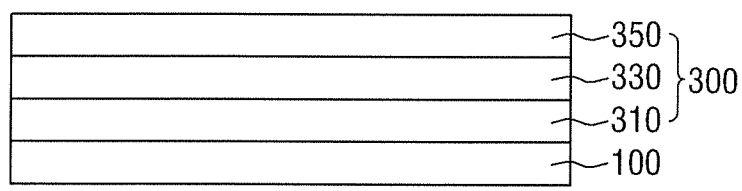
FIG. 2 is a cross-sectional view of an organic light-emitting diode (OLED) shown in FIG. 1.

FIG. 1 is a cross-sectional view of a lighting apparatus 10 according to an embodiment of the present invention. FIG. 2 is a schematic cross-sectional view of an organic light-emitting diode (OLED) 300 shown in FIG. 1.

Referring to FIG. 1, the lighting apparatus 10 according to the current embodiment may include a first substrate 100, the OLED 300, a second substrate 500 and a sealant 700, and may further include a light reflecting member 210.

Each of the first substrate 100 and the second substrate 500 may be an insulating substrate formed of glass, quartz, ceramic, or a flexible substrate formed of polyimide (PI), polycarbonate (PC), polyethylene terephthalate (PET), polyether sulfone (PES), polyethylene naphthalate (PEN), fiber reinforced plastics (FRP) or other polymers. In addition, at least one of the first substrate 100 and the second substrate 500 may be formed of a light transmitting material. In particular, any one of the first substrate 100 and the second substrate 500 which is placed in a direction in which the LED 300 emits light may be formed of a light transmitting material. The first substrate 100 and the second substrate 500 with the OLED 300 interposed therebetween are bonded to each other by a sealant 700. The second substrate 500 is separated from the OLED 300 by a set or predetermined distance. The first substrate 100 and the second substrate 500 protect the OLED 300 against external factors such as external impact, introduction of foreign matter from the outside, or penetration of moisture from the outside.

The OLED 300 may be disposed on the first substrate 100 in an emission region L and may be formed using micro electro mechanical systems (MEMS) technology. The OLED 300 may emit light in response to power supplied from a wiring line disposed on the first substrate 100. In FIG. 1, one OLED 300 is shown to be disposed on the first substrate 100. However, this is merely an example, and a plurality of OLEDs 300 can also be placed on the first substrate 100.

The OLED 300 according to the current embodiment may be a top-emission OLED which emits light in an upward direction of the first substrate 100. However, the present invention is not limited thereto. That is, the OLED 300 according to another embodiment of the present invention may be a bottom-emission OLED which emits light in a downward direction of the first substrate 100. Alternatively, the OLED 300 may be a double-sided emission OLED which emits light in both upward and downward directions of the first substrate 100.

Referring to FIG. 2, the OLED 300 may include a first electrode 310 disposed on the first substrate 100, a second electrode 350 disposed on the first electrode 310, and an organic layer 330 interposed between the first electrode 310 and the second electrode 350.

The organic layer 330 may include a hole injection layer (HIL), a hole transport layer (HTL), an emission layer (EML), an electron transport layer (ETL), and an electron injection layer (EIL) stacked either singularly or in combinations. These layers may be formed of low molecular weight organic materials by vacuum deposition.

The HIL may be formed of a phthalocyanine compound, such as copper phthalocyanine, or a starburst amine such as TCTA, m-MTDATA or m-MTDAPB.

The HTL may be formed of N,N'-bis(3-methylphenyl)-N, N'-diphenyl[1,1-biphenyl]-4,4'-diamine (TPD), N,N'-di (naphthalene-1-yl)-N,N'-diphenyl benzidine ($\alpha$-NPD), etc.

The EIL may be formed of a material such as LiF, NaCl, CsF, $Li_2O$, BaO, Liq, etc.

The ETL may be formed of tris(8-quinolinorate)aluminum ($Alq_3$), 3-(4-biphenylyl)-4-phenyl-5-(4-tert-butyl phenyl)-1, 2,4-triazole (TAZ), etc.

The EML may include a host material and a dopant material. Examples of the host material may include tris(8-hydroxy-quinolinato)aluminum (Alq3), 9,10-di(naphth-2-yl) anthracene (AND), 2-tert-butyl-9,10-di(naphth-2-yl) anthracene (TBADN), 4,4'-bis(2,2'diphenylvinil)-1,1'-biphenyl (DPVBi), 4,4'-Bis[2,2-di(4-methylphenyl)-ethen-1-yl] biphenyl (p-DMDPVBi), tert (9,9-diarylfluorene)s (TDAF), 2-9,9'-spirobifluorene-2-yl)-9,9'-spirobifluorene (BSDF), 2,7-bis(9,9'-spirobifluorene-2-yl)-9,9'-spirobifluorene (TSDF), bis(9,9-diarylfluorene)s (BDAF), 4,4'-bis(2,2-diphenyl-ethene-1-yl)-4,4'-di-(tert-butyl)phenyl (p-TD-PVBi), 1,3-bis(carbazol-9-yl)benzene (mCP), 1,3,5-tris(carbazol-9-yl)benzene (tCP), 4,4',4"-tris(carbazol-9-yl) triphenylamine (TcTa), 4,4'-bis(carbazol-9-yl)biphenyl (CBP), 4,4'-bis 9-carbazolyl)-2,2'-dimethyl-biphenyl (CBDP), 4,4'-bis(carbazol-9-yl)-9,9-dimethyl-fluorene (DMFL-CBP), 4,4'-bis(carbazol-9-yl)-9,9-bis(9-phenyl-9H-carbazol)fluorene (FL-4CBP), 4,4'-bis(carbazol-9-yl)-9,9-di-tolyl-fluorene (DPFL-CBP), and 9,9-bis(9-phenyl-9H-carbazol)fluorene (FL-2CBP).

Examples of the host and dopant materials may include suitable hosts such as $Alq_3$, 4,4'-N,N'-dicarbazole-biphenyl (CBP), poly(n-vinylcarbazole) (PVK) or distyrylarylene (DSA)); red dopants such as PtOEP, $Ir(piq)_3$, $Btp_2Ir(acac)$ or 4-(dicyanomethylene)-2-tert-butyl-6-(1,1,7,7,-tetramethyl-julolidyl-9-enyl)-4H-pyran (DCJTB); green dopants such as $Ir(ppy)_3$ (where "ppy" denotes phenylpyridine), $Ir(ppy)_2$ (acac) or $Ir(mpyp)_3$; and blue dopants such as $F_2Irpic$, $(F_2ppy)_2Ir(tmd)$, $Ir(dfppz)_3$ or ter-fluorene.

The first electrode 310 may be an anode which is a hole injection electrode, and the second electrode 350 may be a cathode which is an electron injection electrode. However, the present invention is not limited thereto, and the first electrode 310 can be a cathode, and the second electrode 350 can be an anode, depending on the type of the OLED 300.

In the current embodiment, the first electrode 310 may be a reflective electrode, and the second electrode 350 may be a transparent electrode.

To this end, the first electrode 310 may be formed of a light reflecting material such as Ag, Mg, Al, Pt, Pd, Au, Ni, Nd, Ir, Cr, Li, Yb or Ca, and the second electrode 350 may be formed of a light transmitting material such as transparent or semi-transparent indium tin oxide (ITO) or indium zinc oxide (IZO). However, these materials are merely examples, and all conducting materials with light reflecting or transmitting properties can be applied to the first electrode 310 or the second electrode 350.

Referring back to FIG. 1, the sealant 700 is disposed between the first substrate 100 and the second substrate 500 and is placed in a non-emission region S along edges of the first substrate 100 and the second substrate 700 so as to bond the first substrate 100 and the second substrate 500 together. Here, the non-emission region S is a region excluding the emission region L. The sealant 700 is separated from the OLED 300 by a distance (e.g., a predetermined distance) and surrounds the OLED 300. The sealant 700 may be formed of a light transmitting material, and the material that forms the sealant 700 is not particularly limited. For example, the sealant 700 may be formed of frit or polymer resin such as epoxy. That is, the sealant 700 according to embodiments of the present invention can be formed of any suitable material that can bond the first substrate 100 and the second substrate 500 together.

First light-scattering particles 710 may be dispersed within the sealant 700. The first light-scattering particles 710 may diffuse or scatter light incident on the sealant 700 from among light emitted from the OLED 300, such that the non-emission region S can also provide light to the outside of the lighting apparatus 10. That is, the first light-scattering particles 710 dispersed inside the sealant 700 can extend the emission region L to the non-emission region S.

The first light-scattering particles 710 may be formed of a material having a different refractive index from the sealant 700, and the material that forms the first light-scattering particles 710 is not particularly limited. For example, the first light-scattering particles 710 may include at least one material selected from $TiO_2$, $ZrO_2$, $ZnO$, $CeO_2$, $TaO_2$, and $SiO_2$. Alternatively, the first light-scattering particles 710 may be formed of bubbles dispersed inside the sealant 700.

The light reflecting member 210 may partially or wholly overlap the non-emission region S of the first substrate 100 and may not overlap a seal region S1 in which the sealant 700 is formed.

The light reflecting member 210 reflects incident light, particularly, portions of light propagated downward of the first substrate 100 from among portions of light scattered by the first light-scattering particles 710, in an upward direction of the first substrate 100. That is, at edges of the lighting apparatus 10, the light reflecting member 210 reduces the leakage of light in a downward direction of the first substrate 100. In other words, the lighting apparatus 10 according to the current embodiment can reduce or minimize light loss in the non-emission region S of the lighting apparatus 10 and enhance light efficiency by using the first light-scattering particles 710 dispersed within the sealant 700 and the light reflecting member 210 disposed in a portion corresponding to the seal region S1. The light reflecting member 210 may be formed only in the seal region S1 in which the sealant 700 is located or may be extended to the non-emission region S as illustrated in the drawing. Alternatively, the light reflecting member 210 may overlap the non-emission region S but may not overlap the seal region S1. In FIG. 1, the light reflecting member 210 is disposed on the first substrate 100 (i.e., on the side facing the OLED). However, this is merely an example, and the light reflecting member 210 may also be disposed under the first substrate 100 (i.e., on the side facing away from the OLED).

The light reflecting member 210 may be formed of a material with high light reflectivity, for example, white resist. Alternatively, the light reflecting member 210 may be formed of a synthetic resin that additionally contains white pigments dispersed therein or a synthetic resin in which metallic particles with superior light reflecting properties are dispersed. The white pigments may be titanium oxide, aluminum oxide, zinc oxide, lead carbonate, barium sulfate, calcium carbonate, etc. As a metallic powder according to one embodiment, silver (Ag) powder with superior reflectivity is added if required. Additionally, according to one embodiment, a fluorescent brightening agent is added. The light reflecting member 210 may also be formed of a metallic material with high photoreflectance. For example, the light reflecting member 210 may be formed of one oxide selected from the group consisting of Ti, Zr, Nb, Al and Si, which are light reflective materials, and at least one material selected from the group consisting of AlN and MgF. The light reflecting member 210 may also be formed of a material selected from the group consisting of $TlO_2$, $Zr_2O$, $Nb_2O_5$, $Al_2O_3$, MgF, AlN and $SiO_2$. The light reflecting member 210 may be formed directly on the first substrate 100 by printing, plating, deposition, etc. or may be attached to the first substrate 100 by using an adhesive material. That is, the material that forms the light reflecting member 210 and the method of forming the light reflecting member 210 are not particularly limited.

Figure 3:
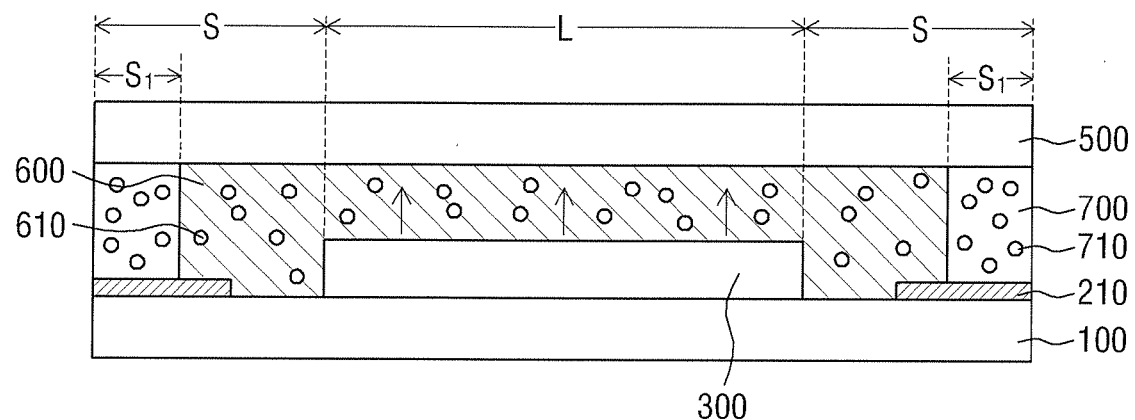
FIG. 3 is a cross-sectional view of a lighting apparatus according to another embodiment of the present invention.

FIG. 3 is a cross-sectional view of a lighting apparatus 10-1 according to another embodiment of the present invention. The lighting apparatus 10-1 according to the current embodiment is partially different from the lighting apparatus 10 of FIG. 1 in that it further includes a filler 600 in a space between a first substrate 100 and a second substrate 500. Other elements are identical to those described above with reference to FIG. 1, and thus their description will be omitted.

Referring to FIG. 3, the lighting apparatus 10-1 according to the current embodiment may further include the filler 600 in the space between the first substrate 100 and the second substrate 500. The filler 600 may cover the OLED 300. The filler 600 protects the OLED 300 and may be formed of an adhesive material in order to bond the first substrate 100 and the second substrate 500 together.

The filler 600 may be formed of a material with superior light transmitting properties. That is, the filler 600 may be formed of a transparent material that does not reduce light emitted from the OLED 300 and does not reduce visibility. The transparent material may be an insulating material having a transmittance of 70 to 100% in a visible range. For example, the filler 600 may be a highly chemically stable, transparent, and heat, electron beam and/or UV curing material selected from the group consisting of epoxy, urethane acrylate, epoxy acrylate, bisphenol A type epoxy, cycloaliphatic epoxy resin, phenyl silicone resin or rubber, acrylic epoxy resin and aliphatic urethane acrylate resin; or may be selected from silicones and silicone oils, that is, from the group consisting of hexamethyldisiloxane, octamethyltrisiloxane, decamethylpentasiloxane, dodecamethylpentasiloxane and polydimethylsiloxane.

If necessary, the filler 600 may further include a moisture absorbent that can absorb moisture and oxygen. The moisture absorbent may be formed of one or more materials with superior moisture absorbing power selected from the group consisting of metal hydride, metal borohydride, alkali earth metal, transition metal, metal oxide, and an organic material. The metal hydride may be LiH or NaH, and the metal borohydride may be $LiBH_4$ or $NaBH_4$. In addition, the metal oxide may be BaO, CaO or SrO.

Second light-scattering particles 610 may be dispersed inside the filler 600. The second light-scattering particles 610 may diffuse or scatter light emitted from the OLED 300, such that the light can also be provided to the non-emission region S.

The second light-scattering particles 610 may be formed of a material having a different refractive index from the filler 600, and the material that forms the second light-scattering particles 610 is not particularly limited. For example, the second light-scattering particles 610, like the first light-scattering particles 710, may include at least one material selected from $TlO_2$, $ZrO_2$, $ZnO$, $CeO_2$, $TaO_2$, and $SiO_2$. Alternatively, the second light-scattering particles 610 may be formed of bubbles dispersed inside the filler 600.

The second light-scattering particles 610 may be uniformly dispersed within the filler 600, and the density of the second light-scattering particles 610 may be different in the emission region L and the non-emission region S. For example, the second light-scattering particles 610 may be more densely populated in the non-emission region S than in the emission region L to better scatter light incident to the non-emission region S. Alternatively, the density of the second light-scattering particles 610 may be increased from the center of the emission region L toward the sealant 700. Consequently, the non-emission region S can provide more uniform light to the outside of the lighting apparatus 10-1, the formation of a dark area with relatively low luminance at edges of the lighting apparatus 10-1 can be reduced, and light extraction efficiency can be improved by further reducing light loss.

Figure 4:
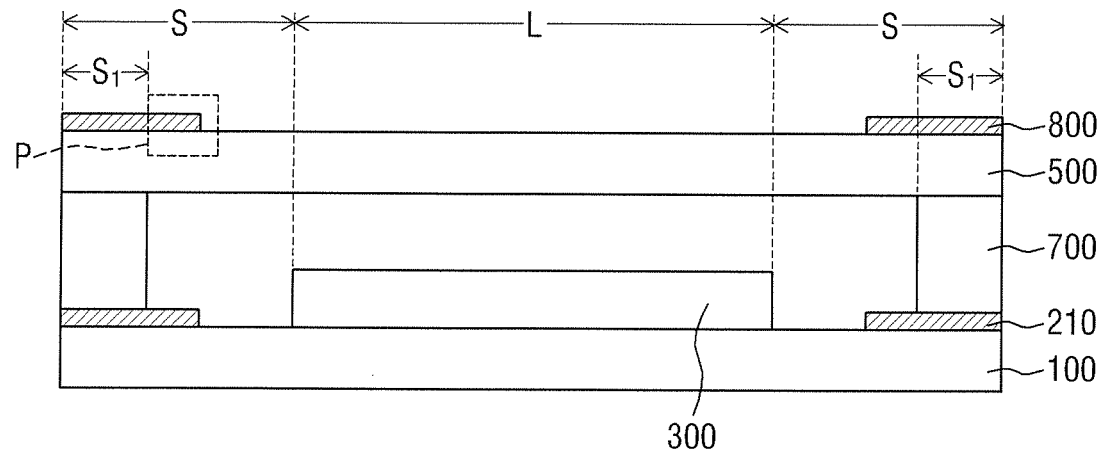
FIG. 4 is a cross-sectional view of a lighting apparatus according to another embodiment of the present invention.

FIG. 4 is a cross-sectional view of a lighting apparatus 10-2 according to another embodiment of the present invention. The lighting apparatus 10-2 according to the current embodiment is partially different from the lighting apparatus 10 of FIG. 1 in that it includes a light-scattering member 800 instead of the first light-scattering particles 710 (see FIG. 1). Other elements are identical to those described above with reference to FIG. 1, and thus their description will be omitted.

Referring to FIG. 4, the lighting apparatus 10-2 according to the current embodiment may include the light-scattering member 800 disposed on a portion of a second substrate 500 which partially or wholly overlaps a non-emission region S. The light-scattering member 800 may also overlap a seal region S1 in which a sealant 700 is formed.

The light-scattering member 800 scatters incident light that transmits through the second substrate 500 from under the second substrate 500. In particular, the light-scattering member 800 scatters incident light that transmits through the sealant 700, light that is emitted from an OLED 300 and incident light that is reflected by a light reflecting member 210 and provides the scattered light to the outside of the lighting apparatus 10-2. That is, at edges of the lighting apparatus 10-2, the light-scattering member 800 uniformly diffuses or scatters light that is provided to the outside of the lighting apparatus 10-2. In other words, the lighting apparatus 10-2 according to the current embodiment can reduce light loss in the non-emission region S of the lighting apparatus 10-2 and enhance the uniformity of light provided to the outside of the lighting apparatus 10-2 by using the light-scattering member 800 and the light reflecting member 210 formed in a portion that overlaps the non-emission region S.

The light-scattering member 800 may be disposed in a portion which overlaps only the seal region S1 or may be extended to a portion which overlaps a larger portion of the non-emission region S as shown in the drawing. The light-scattering member 800 may also be placed to overlap only a portion of the non-emission region S excluding the seal region S1. In FIG. 4, the light-scattering member 800 is disposed on the second substrate 500 (i.e., on the side facing away from the OLED). However, the light-scattering member 800 may also be disposed under a portion of the second substrate 500 (i.e., on the side facing the OLED) which overlaps the non-emission region S. If the light-scattering member 800 is formed under the second substrate 500 (i.e., on the side of the second substrate 500 facing the OLED), it is not exposed to the outside. Therefore, the light-scattering member 800 can be prevented from being damaged by external factors.

FIGS. 5 through 8 illustrate embodiments of the light-scattering member 800 shown in FIG. 4. More specifically, an enlarged view of a portion P of the structure in FIG. 4 is illustrated.

Figure 5:
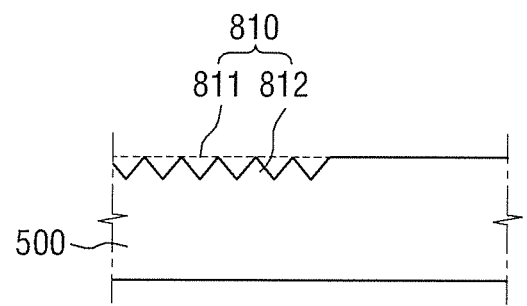
FIGS. 5 through 8 illustrate embodiments of a light-scattering member shown in FIG. 4.

Referring to FIG. 5, a light-scattering member 810 according to the current embodiment is formed by partially patterning a second substrate 500 and includes an uneven pattern composed of recesses 811 and protrusions 812. In FIG. 5, the protrusions 812 of the light-scattering member 812 have a triangular cross-sectional shape. However, this is merely an example, and the protrusions 812 can have various cross-sectional shapes such as a quadrangle, a semicircle, etc. That is, the cross-sectional shape of the protrusions 812 is not particularly limited.

Figure 6:
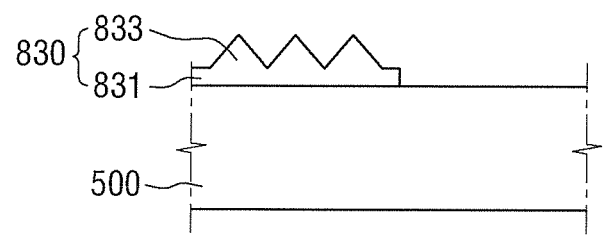

Referring to FIG. 6, a light-scattering member 830 according to the current embodiment may include an optical layer 831 disposed on a second substrate 500 and a light-scattering pattern 833 disposed on the optical layer 831. The optical layer 831 may be formed of at least one of an adhesive film, a retardation film, a polarizing film, and a protective film and may be formed of a stack of two or more layers. Alternatively, the optical layer 831 and the light-scattering pattern 833 may be formed of one sheet of material.

A cross-sectional shape of the light-scattering pattern 833 is not particularly limited. For example, the light-scattering pattern 833 shown in FIG. 6 has a triangular cross-sectional shape. However, this is merely an example, and the cross-sectional shape of the light-scattering pattern 833 may include one or more of a triangle, a quadrangle, and a semicircle. Since the light-scattering member 830 according to the current embodiment scatters light using the light-scattering pattern 833, it can be realized by forming protrusions and recesses in the surface of various layers and films. Alternatively, the light-scattering member 830 may be formed of, but not limited to, a prism sheet or a microlens array sheet.

Figure 7:
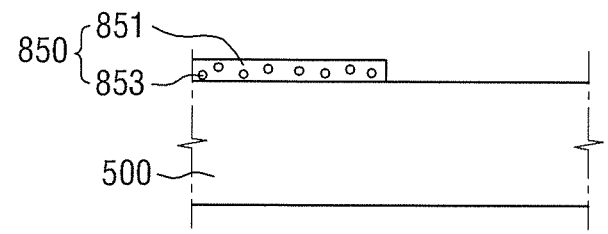

Referring to FIG. 7, a light-scattering member 850 according to the current embodiment may include a base layer 851 disposed on a second substrate 500 and light-scattering particles 853 dispersed in the base layer 851. The base layer 851 may be formed of a resin, and the light-scattering particles 853 may be formed of a material having a different refractive index from that of the base layer 851. The light-scattering particles 853 may scatter incident light that passes through the base layer 851.

Figure 8:
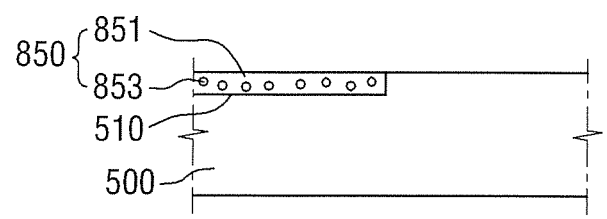

Referring to FIG. 8, a light-scattering member 850 according to the current embodiment, unlike the light-scattering member 850 of FIG. 7, may be disposed in a groove 510 formed in a second substrate 500. According to the current embodiment, since the light-scattering member 850 does not protrude further upward than the second substrate 500, the damage to the light-scattering member 850 by external interference can be reduced or minimized.

Figure 9:
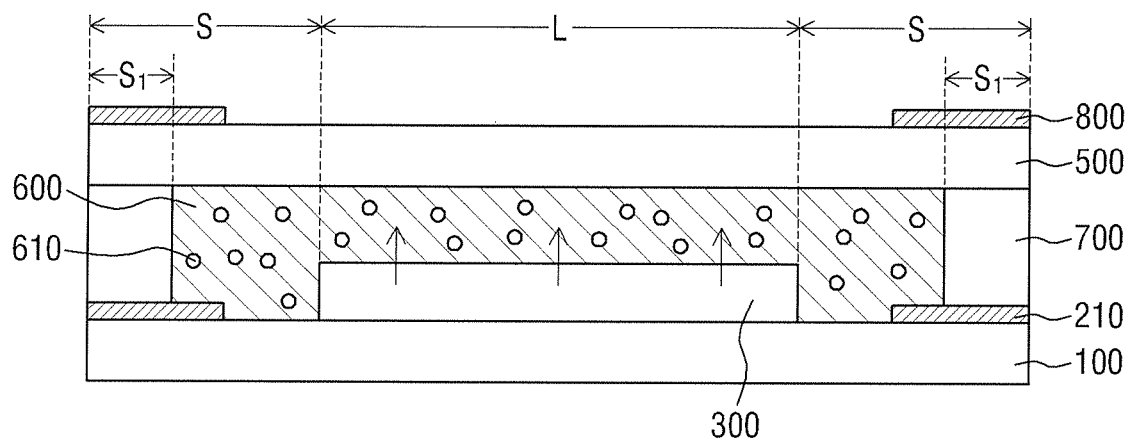
FIG. 9 is a cross-sectional view of a lighting apparatus according to another embodiment of the present invention.
Figure 10:
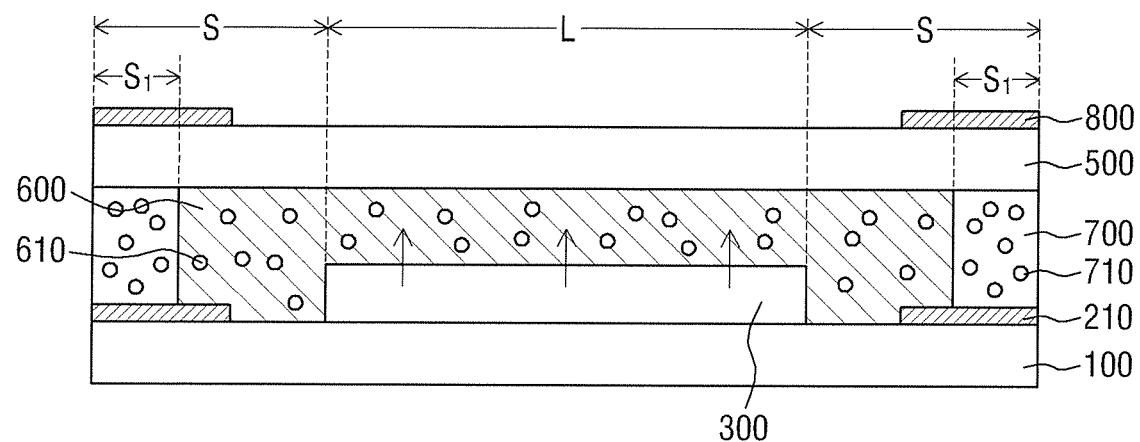
FIG. 10 is a cross-sectional view of a lighting apparatus according to another embodiment of the present invention.

FIGS. 9 and 10 are cross-sectional views of lighting apparatuses 10-3 and 10-4 according to other embodiments of the present invention.

Referring to FIG. 9, the lighting apparatus 10-3 according to the current embodiment may include a filler 600 disposed between a first substrate 100 and a second substrate 500 and second light-scattering particles 610 dispersed in the filler 600, in addition to the structure shown in FIG. 4. The filler 600 and the second light-scattering particles 610 are identical to those described above with reference to FIG. 2, and thus their description will be omitted.

Referring to FIG. 10, the lighting apparatus 10-4 according to the current embodiment may include first light-scattering particles 710 in addition to the structure shown in FIG. 9. That is, the lighting apparatus 10-4 according to the current embodiment may include the first light-scattering particles 710 dispersed in a sealant 700, a light-scattering member 800 disposed on a portion of a second substrate 500 which corresponds to a seal region S1, a filler 600, and second light-scattering particles 610 dispersed in the filler 600, thereby enhancing or maximizing light extraction efficiency. Other elements are identical to those described above with reference to FIGS. 1 through 8, and thus their description will be omitted.

Figure 11:
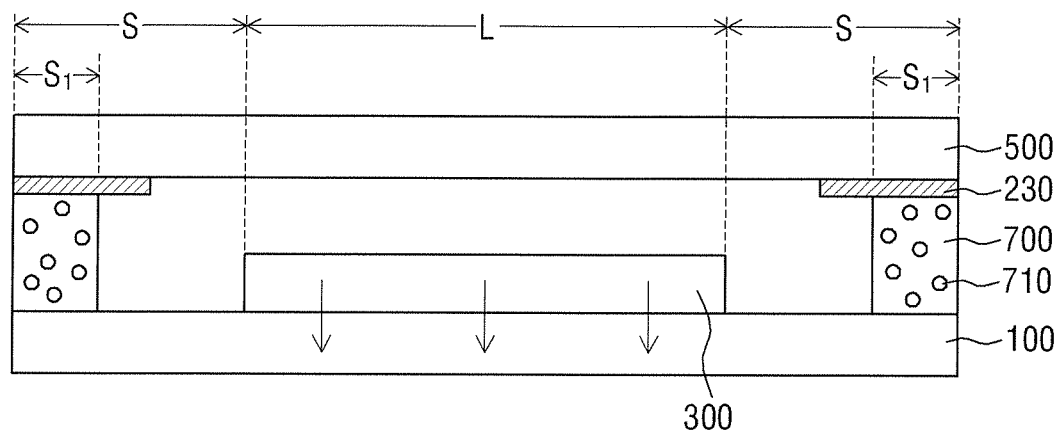
FIG. 11 is a cross-sectional view of a lighting apparatus according to another embodiment of the present invention.

FIG. 11 is a cross-sectional view of a lighting apparatus 10-5 according to another embodiment of the present invention.

The lighting apparatus 10-5 according to the current embodiment is different from the lighting apparatus 10 of FIG. 1 in that an OLED 300 is of a bottom-emission type and that a light reflecting member 230 is formed on a second substrate 500. Other elements are identical to those described above with reference to FIG. 1, and thus the following description will focus on differences.

Referring to FIG. 11, the OLED 300 according to the current embodiment is a bottom-emission type. Referring back to FIG. 2, a first electrode 310 may be a cathode which is an election injection electrode, and a second electrode 350 may be an anode which is a hole injection electrode.

In addition, the first electrode 310 may be a transparent electrode, and the second electrode 350 may be a reflective electrode. To this end, the second electrode 350 may be formed of a light reflecting material such as Ag, Mg, Al, Pt, Pd, Au, Ni, Nd, Ir, Cr, Li, Yb or Ca, and the first electrode 310 may be formed of a light transmitting material such as transparent or semi-transparent ITO or IZO. However, these materials are merely examples, and all conducting materials with light reflecting or transmitting properties can be applied to the first electrode 310 or the second electrode 350. An organic layer 330 is identical to the organic layer 330 described above with reference to FIG. 2, and thus a description thereof will be omitted.

Referring back to FIG. 11, since the OLED 300 is a bottom-emission type OLED which emits light in a downward direction of a first substrate 100, the light reflecting member 230, unlike the light reflecting member 210 of FIG. 1, may be disposed on the second substrate 500. That is, the light reflecting member 230 may be formed on a portion of a bottom surface of the second substrate 500 (i.e., the side facing the OLED) which corresponds to a seal region S1 in which a sealant 700 is located or may be extended to a portion of the bottom surface of the second substrate 500 which corresponds to a non-emission region S as shown in the drawing. Alternatively, the light reflecting member 230 may be formed on the entire bottom surface of the second substrate 500 including the emission region L. The light reflecting member 230 reflects incident light, specifically, reflects light incident to the second substrate 500 in a direction toward the first substrate 100. That is, at edges of the lighting apparatus 10-5, the light reflecting member 230 reduces the leakage of light in a direction upward of the second substrate 500. In other words, the lighting apparatus 10-5 according to the current embodiment can reduce or minimize light loss in the non-emission region S of the lighting apparatus 10-5 and enhance light efficiency by using first light-scattering particles 710 dispersed within the sealant 700 and the light reflecting member 230 disposed in a portion corresponding to at least the seal region S1. In FIG. 11, the light reflecting member 230 is disposed under the second substrate 500 (i.e., on the side facing the OLED). However, this is merely an example, and the light reflecting member 230 may also be disposed on the side of the second substrate 500 facing away from the OLED.

Figure 12:
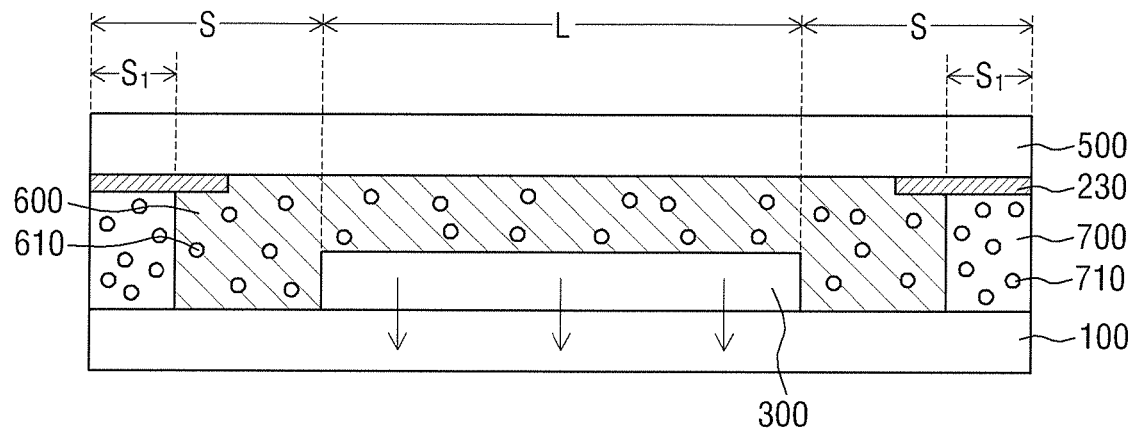
FIG. 12 is a cross-sectional view of a lighting apparatus according to another embodiment of the present invention.

FIG. 12 is a cross-sectional view of a lighting apparatus 10-6 according to another embodiment of the present invention. The lighting apparatus 10-6 according to the current embodiment is partially different from the lighting apparatus 10-5 of FIG. 11 in that it further includes a filler 600 in a space between a first substrate 100 and a second substrate 500. Other elements are identical to those described above with reference to FIGS. 1 and 11, and thus their description will be brief or omitted.

Referring to FIG. 12, the lighting apparatus 10-6 according to the current embodiment may further include the filler 600 in the space between the first substrate 100 and the second substrate 500. The filler 600 may cover the OLED 300. The filler 600 protects the OLED 300 and may be formed of an adhesive material in order to bond the first substrate 100 and the second substrate 500 together.

The filler 600 may be formed of a material with superior light transmitting properties. For example, the filler 600 may be formed of a thermosetting material or a light curable material. If necessary, the filler 600 may further include a moisture absorbent that can absorb moisture and oxygen.

Second light-scattering particles 610 may be dispersed inside the filler 600. The second light-scattering particles 610 may diffuse or scatter light emitted from the OLED 300, such that the light can also be provided to the non-emission region S.

The second light-scattering particles 610 may be formed of a material having a different refractive index from the filler 600, and the material that forms the second light-scattering particles 610 is not particularly limited.

The second light-scattering particles 610 may be uniformly dispersed within the filler 600, or the density of the second light-scattering particles 610 may be different in the emission region L and the non-emission region S. For example, the second light-scattering particles 610 may be more densely populated in the non-emission region S than in the emission region L to better scatter light incident to the non-emission region S. Alternatively, the density of the second light-scattering particles 610 may be increased from the center of the emission region L toward the sealant 700.

Other features of the filler 600 and the second light-scattering particles 610 are identical to those of the filler 600 and the second light-scattering particles 610 described above with reference to FIG. 3, and thus a more detailed description thereof will be omitted.

Figure 13:
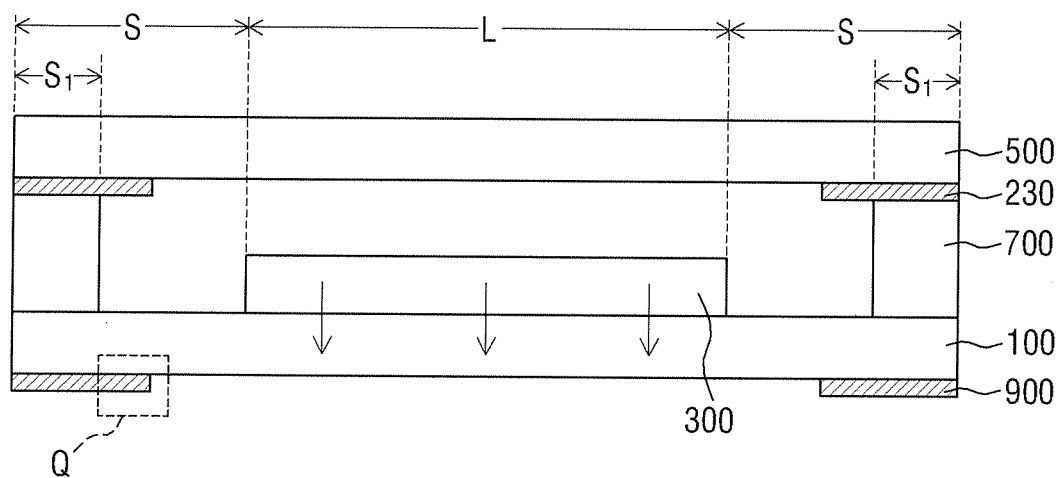
FIG. 13 is a cross-sectional view of a lighting apparatus according to another embodiment of the present invention.

FIG. 13 is a cross-sectional view of a lighting apparatus 10-7 according to another embodiment of the present invention. The lighting apparatus 10-7 according to the current embodiment is partially different from the lighting apparatus 10-2 of FIG. 2 in that the OLED 300 is of a bottom-emission type and that a light-scattering member 900 is formed on the first substrate 100.

Referring to FIG. 13, the lighting apparatus 10-7 according to the current embodiment may include the light-scattering member 900 disposed at a location on a bottom surface of the first substrate 100 (i.e., the side facing away from the OLED) which corresponds to a seal region S1 in which a sealant 700 is formed. That is, the light-scattering member 900 included in the lighting apparatus 10-7 according to the current embodiment scatters incident light that transmits through the first substrate 100 from above the first substrate 100. In particular, the light-scattering member 900 scatters incident light that transmits through the sealant 700, light that is emitted from the OLED 300 and incident light that is reflected by a light reflecting member 230, and provides the scattered light to the outside of the lighting apparatus 10-7. That is, at edges of the lighting apparatus 10-7, the light-scattering member 900 uniformly diffuses or scatters light that is provided to the outside of the lighting apparatus 10-7. Accordingly, the lighting apparatus 10-7 according to the current embodiment can reduce light loss in the non-emission region S of the lighting apparatus 10-7 and enhance the uniformity of light provided to the outside of the lighting apparatus 10-7.

The light-scattering member 900 may be disposed at a location which corresponds to the seal region S1 or may be extended to a location which corresponds to the non-emission region S as shown in the drawing. In FIG. 13, the light-scattering member 900 is disposed under the first substrate 100 (i.e., on the side facing away from the OLED). However, the light-scattering member 900 may also be disposed on a portion of the first substrate 100 which corresponds to the seal region S1 or the non-emission region S (i.e., on the side of the first substrate 100 facing the OLED). If the light-scattering member 900 is formed on the first substrate 100 (i.e., on the side of the first substrate 100 facing the OLED), it is not exposed to the outside. Therefore, the light-scattering member 900 can be prevented from being damaged by external factors.

The shape of the light-scattering member 900 is not particularly limited. For example, an enlarged view of a portion Q of FIG. 13 may be similar to that of the portion P of FIG. 4. The light-scattering member 900 may include an uneven pattern formed on a surface of the first substrate 100, as described above with reference to FIG. 5. Alternatively, as described above with reference to FIG. 6, the light-scattering member 900 may include: an optical layer disposed under (i.e., the side facing away from the OLED) or over (i.e., the side facing the OLED) the first substrate 100; and a light-scattering pattern disposed on the optical layer. Alternatively, as described above with reference to FIGS. 7 and 8, the light-scattering member 900 may include: a base layer and light-scattering particles dispersed in the base layer. Alternatively, as described above with reference to FIG. 8, the light-scattering member 900 may be disposed in a groove formed in the first substrate 100. That is, the descriptions of FIGS. 5 through 8 may also be applicable to the light-scattering member 900 according to the current embodiment.

Figure 14:
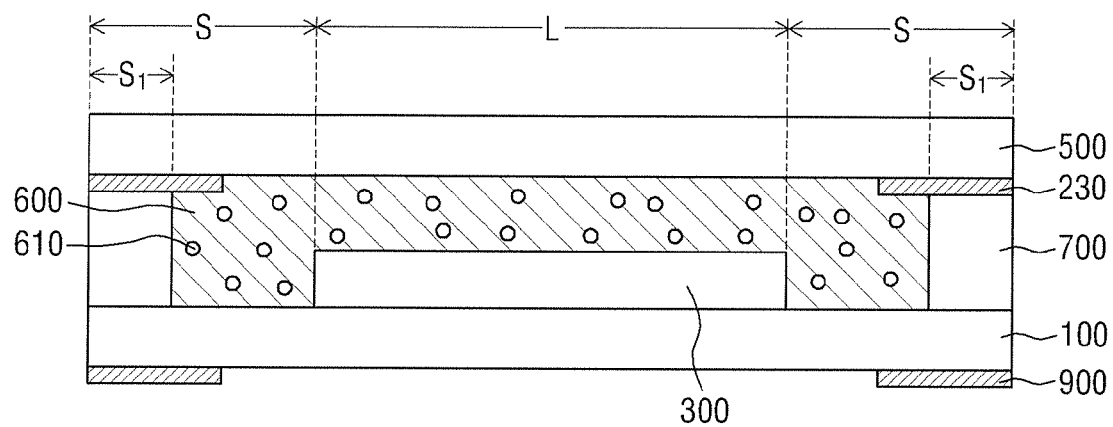
FIG. 14 is a cross-sectional view of a lighting apparatus according to another embodiment of the present invention.
Figure 15:
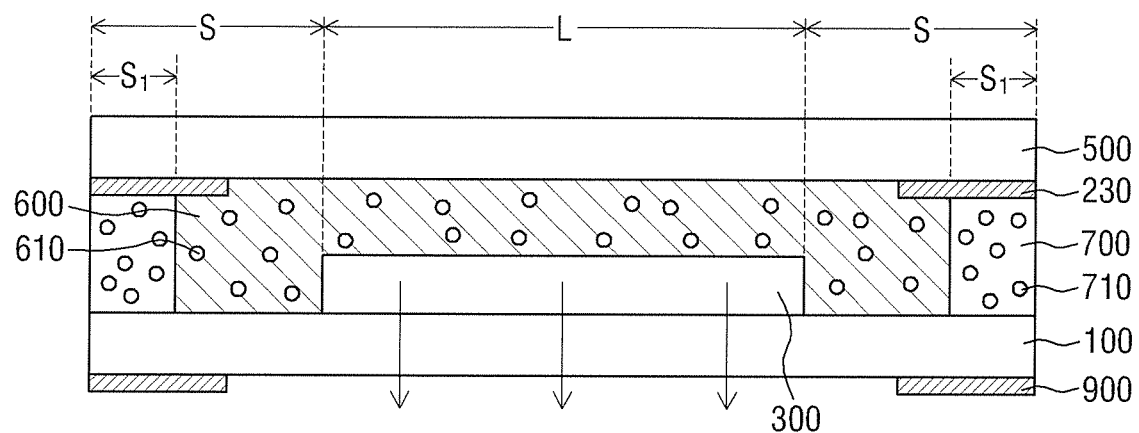
FIG. 15 is a cross-sectional view of a lighting apparatus according to another embodiment of the present invention.

FIGS. 14 and 15 are cross-sectional views of lighting apparatuses 10-8 and 10-9 according to other embodiments of the present invention.

Referring to FIG. 14, the lighting apparatus 10-8 according to the current embodiment may include a filler 600 disposed between the first substrate 100 and the second substrate 500 and second light-scattering particles 610 dispersed in the filler 600, in addition to the structure shown in FIG. 13. The filler 600 and the second light-scattering particles 610 are identical to those described above with reference to FIG. 3, and thus their description will be omitted.

Referring to FIG. 15, the lighting apparatus 10-9 according to the current embodiment may include first light-scattering particles 710 in addition to the structure shown in FIG. 14. That is, the lighting apparatus 10-9 according to the current embodiment may include the first light-scattering particles 710 dispersed in a sealant 700, a light-scattering member 900 disposed under a portion of a first substrate 100 which corresponds to a seal region S1, a filler 600 disposed between the first substrate 100 and a second substrate 500, and second light-scattering particles 610 dispersed in the filler 600, thereby enhancing or maximizing light extraction efficiency. Other elements are identical to those described above with reference to FIGS. 1 through 8 and 11 through 13, and thus their description will be omitted.

Figure 16:
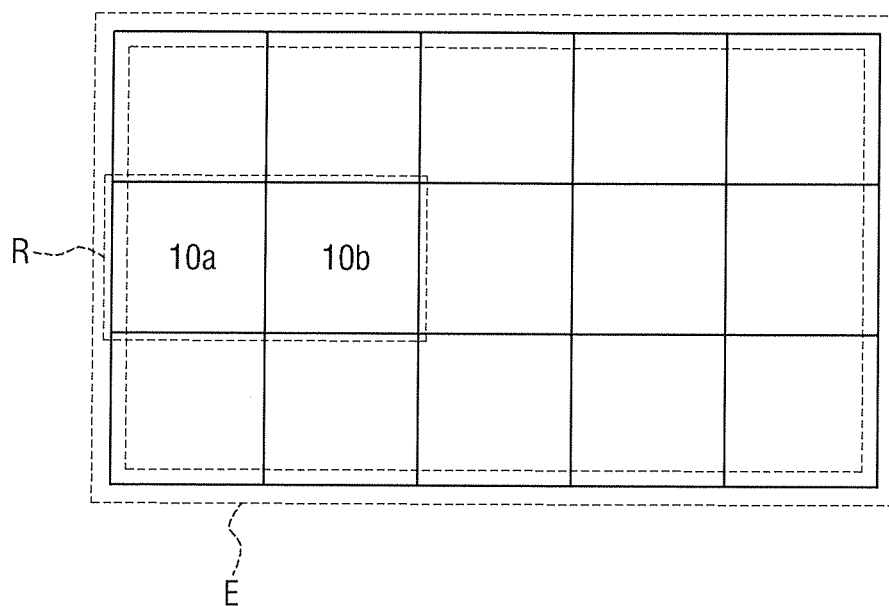
FIG. 16 is a plan view of a lighting unit according to an embodiment of the present invention.
Figure 17:
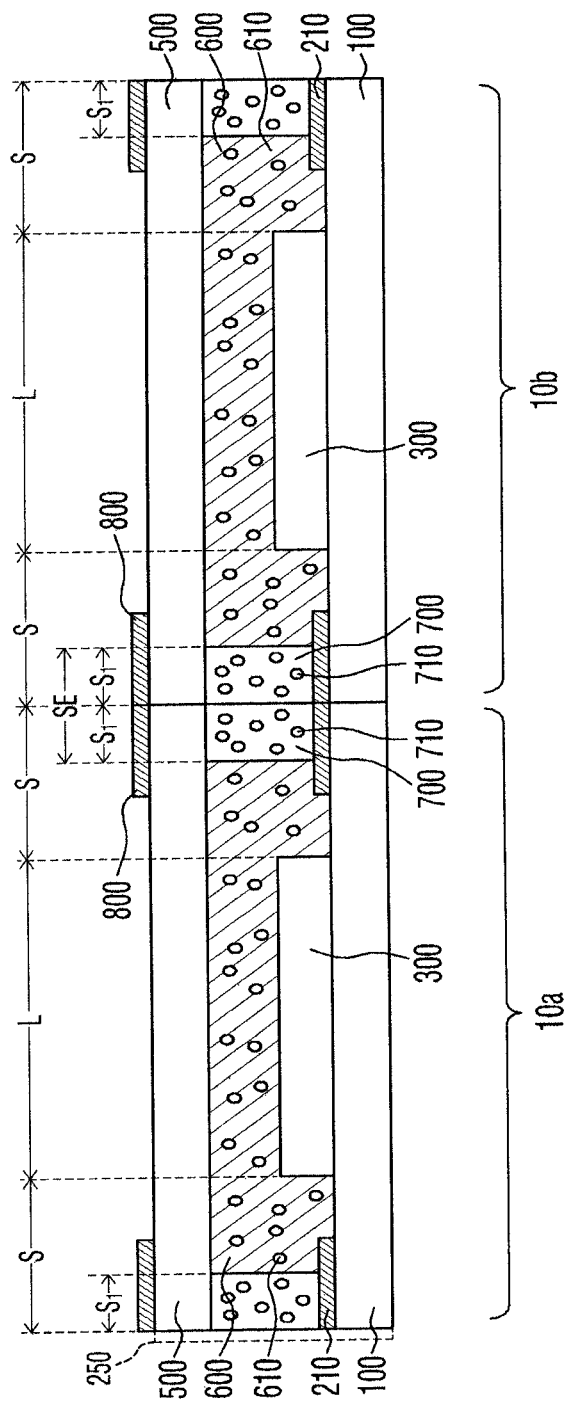
FIG. 17 is a cross-sectional view of a portion of the lighting unit shown in FIG. 16.

FIG. 16 is a plan view of a lighting unit 1 according to an embodiment of the present invention. FIG. 17 is a cross-sectional view of a portion R of the lighting unit 1 shown in FIG. 16.

Referring to FIG. 16, the lighting unit 1 according to the current embodiment may include a plurality of lighting apparatuses such as those described above with reference to FIGS. 1 through 15, and edges of the lighting apparatuses may be aligned with each other to form a tiled-shape. When the lighting unit 1 is formed in this way, surface lighting can be realized more easily. Particularly, large-area lighting can be realized more easily.

FIG. 17 is a cross-sectional view of the portion R of the lighting unit 1 shown in FIG. 16. Referring to FIG. 17, edges of two lighting apparatuses 10*a* and 10*b* may be aligned with each other. In FIG. 17, the lighting apparatuses 10*a* and 10*b* included in the lighting unit 1 are structured as shown in FIG. 10. However, this is merely an example, and the lighting apparatuses 10*a* and 10*b* may also be structured as shown in FIGS. 1 through 4, 9, and 11 through 15.

The lighting unit 1 according to the current embodiment may have a structure in which the edges of the lighting apparatuses 10*a* and 10*b* are aligned with each other. In a comparable tile-shaped lighting unit, a dark area is formed in a seal region of each lighting apparatus or in a boundary region between the lighting apparatuses due to a sealant disposed at the edges of each lighting apparatus. However, in the lighting unit 1 according to the present invention, each of the lighting apparatuses 10*a* and 10*b* further includes one or more of first light-scattering particles 710 dispersed in a sealant 700, a light reflecting member 210 disposed at a location on a top (i.e., the side facing the OLED) or bottom (i.e., the side facing away from the OLED) surface of a first substrate 100 which corresponds to a seal region S1, and a light-scattering member 800 disposed at a location on a top (i.e., the side facing away from the OLED) or bottom surface (i.e., the side facing the OLED) of a second substrate 500 which corresponds to the seal region S1. Therefore, light extraction efficiency can be improved, and the formation of a dark area in the seal region S1 or in a boundary region SE between the lighting apparatuses 10*a* and 10*b* can be reduced.

The lighting unit 1 according to the current embodiment may further include a lateral light reflecting member 250 disposed at edges E (see FIG. 16) thereof. Specifically, as shown in FIG. 17, the lateral light reflecting member 250 may be disposed on a side surface of the lighting apparatus 10*a* located at an edge E (see FIG. 16) of the lighting unit 1. The lateral light reflecting member 250 may reflect light that propagates toward the edges E (see FIG. 16) of the lighting unit 1 after passing through the sealant 700, thereby reducing or minimizing the leakage of light at the edges E (see FIG. 16) of the lighting unit 1 and further improving light extraction efficiency. The lateral light reflecting member 250 may be formed of a material used to form the light reflecting member 210 described above with reference to FIG. 1. The lateral light reflecting member 250 may be coupled to the lighting apparatus 10*a* by an adhesive member and may be formed directly on the side surface of the lighting apparatus 10*a*. In addition, the lateral light reflecting member 250 may be formed not only on a side surface of the sealant 700 but also be extended to side surfaces of the first substrate 100 and the second substrate 500 or to any one of the side surfaces of the first substrate 100 and the second substrate 500.

Other elements of the lighting apparatuses 10a and 10b are identical to those described above, and thus their description will be omitted.

Embodiments of the present invention provide at least one of the following enhancements.

According to embodiments of the present invention, a lighting apparatus and a lighting unit with improved light extraction efficiency are provided.

In addition, according to embodiments of the present invention, a lighting apparatus and a lighting unit which reduce the formation of a dark area at edges thereof and provide uniform light to the outside are provided.

However, the effects of the present invention are not restricted to the one set forth herein. The above and other effects of the present invention will become more apparent to one of daily skill in the art to which the present invention pertains by referencing the claims.

While the present invention has been particularly shown and described with reference to example embodiments thereof, it will be understood by those of ordinary skill in the art that various changes in form and detail may be made therein without departing from the spirit and scope of the present invention as defined by the following claims, and equivalents thereof. The exemplary embodiments should be considered in a descriptive sense only and not for purposes of limitation.

What is claimed is:

1. A lighting apparatus, comprising:
   a first substrate;
   an organic light-emitting diode (OLED) on the first substrate to define an emission region and configured to emit light;
   a second substrate facing the first substrate with the OLED interposed therebetween;
   a sealant between the first substrate and the second substrate, which bonds the first substrate and the second substrate together, and surrounds the OLED at a distance from the OLED,
   wherein the sealant comprises first light-scattering particles dispersed in the sealant and configured to diffuse light incident to the sealant; and
   a filler which fills a space between the first substrate and the second substrate, wherein the filler comprises second light-scattering particles dispersed in the filler and configured to scatter light emitted from the OLED,
   wherein the density of the second light-scattering particles is higher in a non-emission region outside the emission region than in the emission region.

2. A lighting apparatus comprising:
   a first substrate;
   an OLED on the first substrate to define an emission region and configured to emit light;
   a second substrate facing the first substrate with the OLED interposed therebetween;
   a sealant disposed between the first substrate and the second substrate, which bonds the first substrate and the second substrate together, and surrounds the OLED at a distance from the OLED; and
   a light-scattering member partially or wholly overlapping a non-emission region outside the emission region, a projection of the light-scattering member on the first substrate being laterally apart from a projection of the emission region on the first substrate.

3. The lighting apparatus of claim 2, wherein the light scattering member is disposed on a side of the first substrate facing away from the OLED or on a side of the second substrate facing away from the OLED.

4. The lighting apparatus of claim 2, further comprising:
   a filler which fills a space between the first substrate and the second substrate, wherein the filler comprises second light-scattering particles dispersed in the filler and configured to scatter light emitted from the OLED.

5. The lighting apparatus of claim 2, further comprising:
   a light reflecting member on a side of the first substrate facing the OLED or on a side of the second substrate facing the OLED and configured to diffuse light, wherein the light reflecting member partially or wholly overlaps the non-emission region outside the emission region.

* * * * *